United States Patent
Chantre et al.

(10) Patent No.: US 6,472,262 B2
(45) Date of Patent: Oct. 29, 2002

(54) METHOD FOR FABRICATING A BIPOLAR TRANSISTOR OF THE SELF-ALIGNED DOUBLE-POLYSILICON TYPE WITH A HETEROJUNCTION BASE AND CORRESPONDING TRANSISTOR

(75) Inventors: Alain Chantre, Seyssins; Didier Dutartre, Meylan; Hélène Baudry, Grenoble, all of (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/817,898

(22) Filed: Mar. 26, 2001

(65) Prior Publication Data

US 2001/0053584 A1 Dec. 20, 2001

(30) Foreign Application Priority Data

Mar. 27, 2000 (FR) .............................. 00 03845

(51) Int. Cl.$^7$ .......................... H01L 21/8249

(52) U.S. Cl. ...................... 438/235; 438/309

(58) Field of Search .......... 438/94, 189, 191, 438/202, 235, 236, 309, 311, 312, 313, 314, 341, 400, 481, 933

(56) References Cited

U.S. PATENT DOCUMENTS

| | | | | |
|---|---|---|---|---|
| 5,340,753 A | * | 8/1994 | Bassous et al. | 438/309 |
| 5,391,503 A | * | 2/1995 | Miwa et al. | 438/235 |
| 5,494,836 A | | 2/1996 | Imai | |
| 5,656,514 A | * | 8/1997 | Ahlgren et al. | 438/320 |
| 5,897,359 A | | 4/1999 | Cho et al. | |

* cited by examiner

*Primary Examiner*—David Nelms
*Assistant Examiner*—David Nhu
(74) *Attorney, Agent, or Firm*—Lisa K. Jorgenson; Jon A. Gibbons; Fleit, Kain, Gibbons, Gutman & Bongini P.L.

(57) ABSTRACT

A self-aligned double-polysilicon type bi-polar transistor with a heterojunction base comprises a semiconducting heterojunction region lying over an active region of a semiconductor substrate and over an isolating region delimiting the active region, and incorporating the intrinsic base region of the transistor. An emitter region situated above the active region and coming into contact with the upper surface of the semiconducting heterojunction region. A polysilicon layer forming the extrinsic base region of the transistor, situated on each side of the emitter region and separated from the semiconducting heterojunction region by a separation layer comprising an electrically conducting connection part situated just outside the emitter region. This connection part ensures an electrical contact between the extrinsic base and the intrinsic base.

23 Claims, 3 Drawing Sheets

METHOD FOR FABRICATING A BIPOLAR TRANSISTOR OF THE SELF-ALIGNED DOUBLE-POLYSILICON TYPE WITH A HETEROJUNCTION BASE AND CORRESPONDING TRANSISTOR

CROSS-REFERENCE TO RELATED APPLICATIONS

This application is based upon and claims priority from prior French Patent Application No. 0003845 filed Mar. 27, 2000, and is hereby incorporated by reference in its entirety.

BACKGROUND OF THE INVENTION

1. Field of the Invention

The present invention relates to the field of semiconductor components, especially those intended to be integrated into high-frequency and Very Large Scale Integration (VLSI) technologies and more particularly, the present invention relater to fabricating self-aligned double-polysilicon type bipolar transistors with a silicon-germanium heterojunction base, especially those having an epitaxially grown base.

2. Description of Related Art

Generally, a double-polysilicon type bipolar transistor, has an extrinsic base and emitter are made of polycrystalline silicon (polysilicon). In contrast, a single-polycrystalline bipolar transistor only the emitter is made of polysilicon.

A double-polysilicon transistor is called "self-aligned" when the distance between the polysilicon of the extrinsic base and the polysilicon of the emitter is not defined by any photolithographic operation. Stated differently, a transistor is "self-aligned" regardless of any adjustment of two photolithographic masks, one mask with respect to the other mask.

In a conventional method for fabricating a self-aligned double-polysilicon bipolar transistor, the intrinsic base is implanted. A stack of layers comprising a polysilicon layer heavily doped with a conductivity type opposite to that of the substrate (for example p$^+$-doped) is deposited over an active region of a semiconductor substrate having a given conductivity type (for example then n type). This polysilicon later is surmounted by an upper insulating layer, for example made of silicon dioxide. The p$^+$ polysilicon layer is intended eventually to form the extrinsic base of the transistor. The stack above the active region is then etched so as to define an emitter window. Electrically insulating regions or "spacers" are made on the walls of the emitter window. Next, polysilicon is deposited in the emitter window so as to form the emitter region. This emitter region is thus insulated from the extrinsic base by the internal spacers and also by a part of the upper insulating region of the stack on which this emitter region partially rests.

The above techinique for manufacturing self-aligned double-polysilicon transistors although useful is not without its shortcomings. One shortcoming is over-etching.

During the operation of etching the stack, over-etching occurs. The effect of over-etching is to remove part of the silicon from the active region. The control and the reproducibility of this over-etching for an implanted base transistor typically allows the intrinsic base to be implanted after opening the emitter window.

In contrast, the control and reproduciblity is much more difficult for a transistor with an epitaxially grown base. Moreover, this difficulty is especially true for an intrinsic base with a silicon-germanium heterojunction. Because, in the transistors with an epitaxially grown base, non-selective epitaxy is generally used to deposit a semiconducting region within which the future intrinsic base is made, over the active region and over the isolating regions delimiting this active region. The abovementioned stack of layers is then deposited on this first semiconducting region. However, the thickness of the first semiconducting region, that is to say the thickness of the intrinsic base, is particularly small, typically a few tens of nanometers. Also, this intrinsic base, which is already particularly thin to start with, is inevitably partially etched. Over-etching results from the etching of the stack which forms the emitter window. Over-etching leads to damage of the electrical operation of the transistor and may result in a defective transistor.

One solution of over-etching know in the art to overcome the above shortcomings, consists in epitaxially growing the intrinsic base after once the emitter window has been etched. However, such a solution requires the use of selective epitaxy, which presents other, more delicate, technological problems than for non-selective epitaxy. One problem is the requirement of tighter control of the thickness of the base. And another problem is ensuring ensuring the epitaxially grown base is of good quality.

Accordingly, a need exists to overcome the above problems and to provide a solution to overcome the over-etching during the formation of the stack in a self-aligned double-polysilicon transistor using non-selective epitaxy.

SUMMARY OF THE INVENTION

The present invention provides a method to make a transistor of the self-aligned double-polysilicon type with a heterojunction base, which uses non-selective epitaxy of the base while at the same time avoiding the problem of the overetching described above.

The present invention includes a method for fabricating a self-aligned double-polysilicon type bipolar transistor of with a heterojunction base, in which a semiconducting heterojunction region covering an active region of a semiconductor substrate and an isolating region surrounding the active region are formed by non-selective epitaxy. A stack comprising an etch-stop layer, for example made of silicon dioxide obtained from tetraethyl orthosilicate (TEOS), are formed on the semiconducting heterojunction region. This etch-stop layer is surmounted by a polysilicon layer having the same type of conductivity as the heterojunction region and overdoped with respect to this heterojunction region. Moreover, the stack comprises at least one upper insulating layer, for example, made of silicon oxide obtained from TEOS.

The stack is etched, stopping on the stop layer so as to define an emitter window above the active region. The portion of this stop layer situated at the bottom of the emitter window is removed and the stop layer is replaced locally by an electrically conducting replacement material at the outer periphery of the emitter window (for example, a heavily doped silicon-germanium alloy). The emitter region resting partially on the upper insulating layer of the stack is then formed in the emitter window.

Thus, the presence of the etch-stop layer makes it possible to prevent overetching of the semiconducting heterojunction region (which is intended to form the intrinsic base of the transistor) which has previously been obtained by non-selective epitaxy. In addition, the presence of the electrically conducting replacement material placed locally between the semiconducting heterojunction region and the polysilicon layer (which is intended to form the extrinsic base region of the transistor) makes it possible to ensure an electrical contact between the extrinsic base and the intrinsic base.

According to one method of implementing the invention, the heterojunction region comprises a layer made of a silicon-germanium alloy surmounted by a silicon layer. A replacement material, which is selectively removable with respect to the silicon, is then chosen. Also, after the emitter window is etched, the stop layer is removed from the bottom of the emitter window and locally under the polysilicon layer at the outer periphery of the emitter window. A layer formed from the replacement material is then deposited and then this layer formed from the replacement material is etched so as to leave the replacement material only between the heterojunction region and the polysilicon layer.

In one embodiment, two different materials are used for the stop layer and for the upper insulating layer of the stack. A stop layer made of silicon nitride could thus be used, while the upper insulating layer of the stack is made of silicon oxide obtained from TEOS. However, it is also possible for the stop layer to be formed from the same material as that forming the upper insulating layer of the stack, for example silicon oxide obtained from TEOS. In this case, a protective layer made of a material which is different to that of the stop layer (the protective layer could be made, for example, of silicon nitride) is formed in addition on the upper surface of the stack and on the walls of the emitter window.

This avoids damaging the upper insulating layer of the stack when the stop layer is removed, for example by wet deoxidation.

The protective layer is then removed and the layer formed from the replacement material is then deposited.

When the layer of the replacement material is isotropically etched, the stop layer under the polysilicon layer must be locally removed over enough length to guarantee, after the isotropic etching of the layer of replacement material, enough presence of this replacement material under the polysilicon layer. By way of example, this stop layer under the polysilicon layer can be locally removed over a length which is at least five times greater than the thickness of the layer of replacement material.

The invention also proposes a bipolar transistor of the self-aligned double-polysilicon type with a heterojunction base, comprising:

- a semiconducting heterojunction region having an upper surface, the semiconducting hertorjunction region lying over an active region of a semiconductor substrate and over an isolating region delimiting the active region, and incorporating an intrinsic base region of the transistor;
- an emitter region situated above the active region and coming into contact with the upper surface of the semiconducting heterojunction region;
- a polysilicon layer forming an extrinsic base region of the transistor, situated on each side of the emitter region and separated from the semiconducting heterojunction region by a separation layer comprising an electrically conducting connection part situated just outside the emitter region, this connection part ensuring an electrical contact between the extrinsic base and the intrinsic base.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description of the invention taken by way of entirely non-limiting example and illustrated by the attached drawing in which:

DETAILED DESCRIPTION OF PREFERRED EMBODIMENTS

Figure 1:
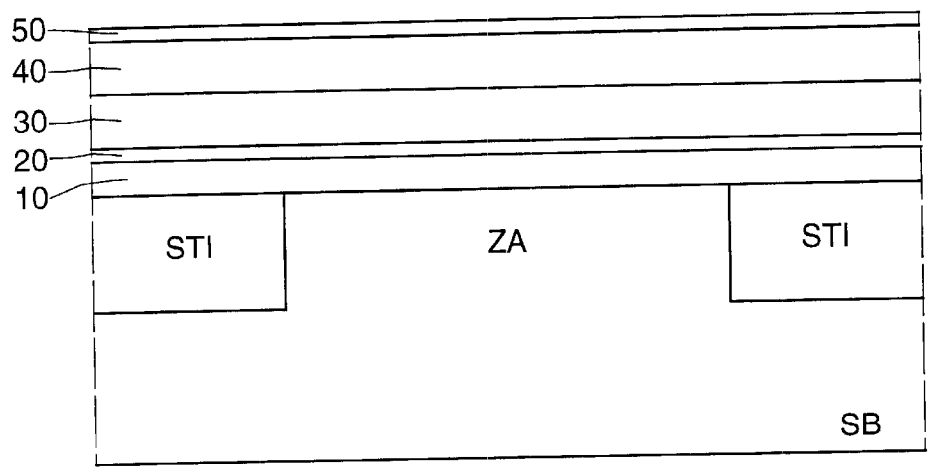
FIGS. 1 through 5 are a series of block diagrams illustrating the major fabrication steps of a self-aligned double-polysilicon transistor, according to the present invention.

It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

Turning to FIG. 1, the reference SB denotes a semiconductor substrate. For example substrate SB maybe made of silicon and havie n-type conductivity. An active region ZA is delimited within this substrate SB, in a conventional manner known to those of average skill in the art, by making isolating regions STI on both sides of this region ZA. One example by a process known to those of average skilled in the art is known by the name of "Shallow Trench Isolation". This active region forms the intrinsic collector of the transistor.

A semiconducting heterojunction region 10 is then grown by non-selective epitaxy. Non-selective epitaxy is characterized by a growth of this semiconducting heterojunction reion 10 not only on the active region ZA, but also on the isolating regions STI.

The semiconducting heterojunction region 10 is typically made from silicon-germanium with a thickness of a few tens of nanometers, for example between approximately 50 and 80 nanometers. In one embodiment, the semiconducting heterojunciton region 10 is actually formed by several superimposed layers. Thus, a first layer of undoped silicon is grown by non-selective epitaxy. A second layer made of silicon-germanium is then epitaxially grown, this second layer being formed, for example, by a first sublayer of $Si_{1-x}Ge_x$, (where x is a constant between approximately 0.1 and 0.2) surmounted by a second sublayer also formed from an $Si_{1-x}Ge_x$, alloy (where, for example, x decreases down to approximately 0) and p-doped by boron. The second sublayer is then surmounted by an epitaxially grown layer of silicon p-doped by boron.

At the end of this epitaxy, typically carried out at 700° C. in an ultraclean CVD deposition reactor, a stack of layers is obtained, enabling an intrinsic base with a silicon-germanium heterojunction to be made.

A thin layer 20 (typically having a thickness of between 20 and 50 nm), for example made of silicon dioxide obtained from tetraethyl orthosilicate (TEOS), is then deposited on the region 10.

A polysilicon layer 30 which is intended, as will be seen in more detail below, to form the future extrinsic base of the transistor, is then made by any conventional process such as deposition in a CVD reactor. For this purpose, this polysilicon layer 30 is more heavily doped than the intrinsic base region 10. By way of example, a concentration of $p^+$-dopants of about $10^{19}$ to $10^{20}$ at/cm$^3$ may be provided. The polysilicon region 30 could be doped in this way either in situ during deposition or by implantation once the layer 30 is deposited.

The layer 30 is then covered with an upper insulating layer 40, made for example from silicon oxide obtained from TEOS.

Finally, since the layer 20, which will act as an etch-stop layer, as will be seen in more detail below, is made from a dielectric similar to that used for the upper insulating layer 40, this upper insulating layer 4 is covered with a protective layer 50 made of a dielectric, for example silicon nitride Si$_3$N$_4$, which is different to that constituting the stop layer.

The formation of these layers 4 and 5 is conventional in bipolar transistor technology and the conditions for producing such layers are well known to those of average skilled in the art.

Figure 2:
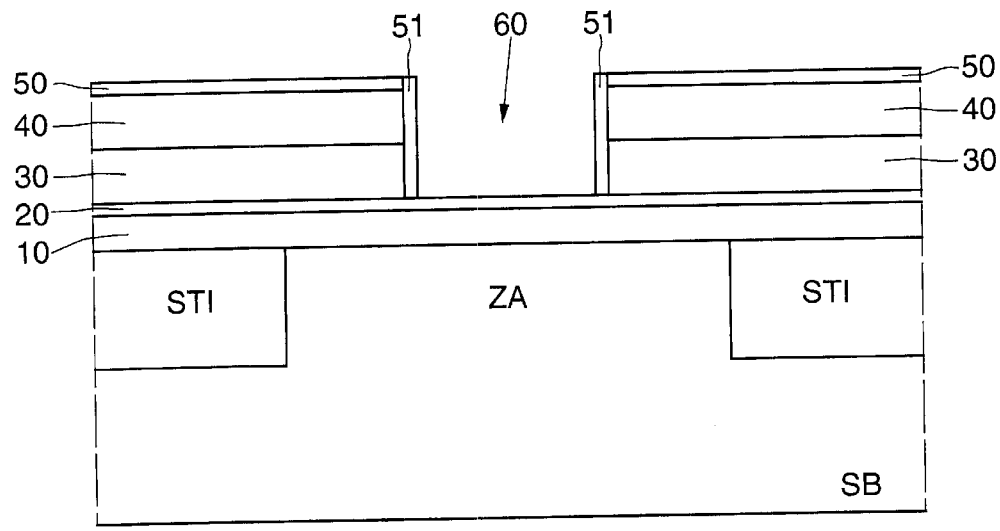

An emitter window 60 is then defined, as illustrated in FIG. 2, in the stack formed from layers 30, 40 and 50, above the active region ZA. The emitter window 60 is produced, for example, conventionally by masking then by etching the various layers, for example by dry anisotropic etching, in particular by plasma.

It should be noted here that this operation of etching the stack is stopped on the stop layer 20 because of the etching selectivity between the polysilicon and the silicon dioxide.

Insulating regions 51 are then made on the walls of the emitter window 60, said regions being made from the same material as that forming the protective layer 50, in this case silicon nitride. These insulating regions are made by depositing a layer of silicon nitride in the emitter window, then by etching this silicon nitride layer so as to obtain the regions or spacers 51. It is worth noting here that during this operation of forming (etching) the spacers 51, the layer 20 also acts as a stop layer.

Figure 3:
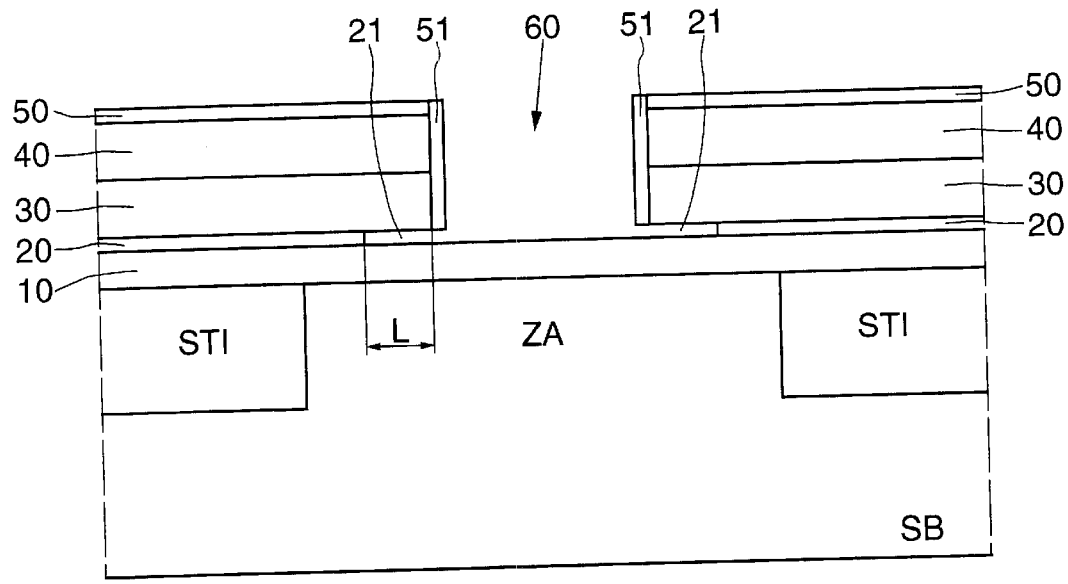

Next, as illustrated in FIG. 3, the stop layer 20 situated in the bottom of the emitter window 60 is removed and this stop layer 20 is removed locally under the polysilicon region 30, and consequently between this region 30 and the semiconducting region 10. The stop layer is removed by conventional wet etching. This localized removal 21 under the polysilicon layer 30 extends over a length L which is, for example, between 100 and 150 nanometers for a stop layer 20 thickness of about 20 nm.

Next, the protective silicon nitride layer 50 and 51 is removed, also by using conventional wet etching.

Figure 4:
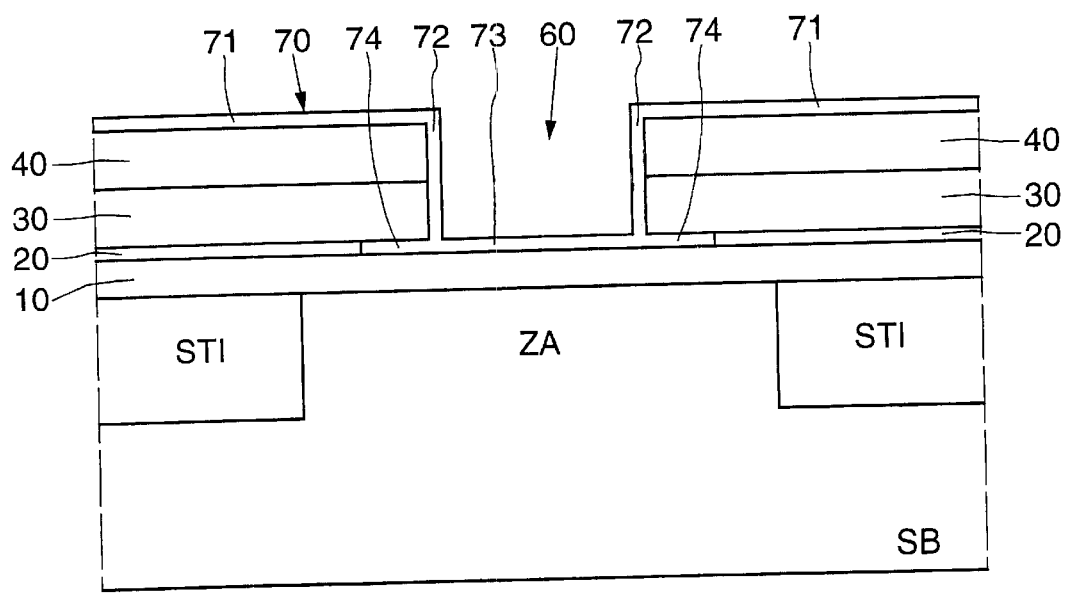

Next, as illustrated in FIG. 4, a layer 70, made of an electrically conducting material which here is selectively removable with respect to the silicon of the layer 30 and to the dielectric of the layer 40, is deposited, for example by any conventional process such as CVD or plasma-enhanced chemical vapour deposition (PECVD).

As illustrated in FIG. 4, this layer 70 comprises an upper portion 71 lying over the residual portion 40 of the upper insulating layer of the stack, a vertical portion 72 lying over the walls of the emitter window 60, a horizontal portion 73 lying in the bottom of the emitter window 60, and a portion 74 lying under the residual polysilicon layer 30 between this layer 30 and the heterojunction region 10, replacing the locally etched stop layer.

The thickness of this layer of fill material is approximately equal to the thickness of the stop layer 20.

Any material which is electrically conducting and selectively removable with respect to the silicon may be suitable, in particular a heavily doped silicon-germanium alloy.

For this purpose, silicon-germanium alloys with a relatively high germanium content, usually about 10 to 50% germanium, are preferably used, since the selectivity of etching the SiGe alloy as compared with silicon. The SiO$_2$ increases with the germanium content of the alloy.

As for the doping, in this case, for example, a p$^+$-doped silicon-germanium alloy (since the intrinsic base and the extrinsic base have p-type conductivity) with a dopant concentration of about, for example, $10^{20}$ at/cm$^3$, is chosen. This doping maybe carried out in situ when depositing the layer 70.

Here, there replacement material 70 must also be selectively removable with respect to the material forming the upper insulating layer of the stack, i.e. in this case silicon dioxide.

Figure 5:
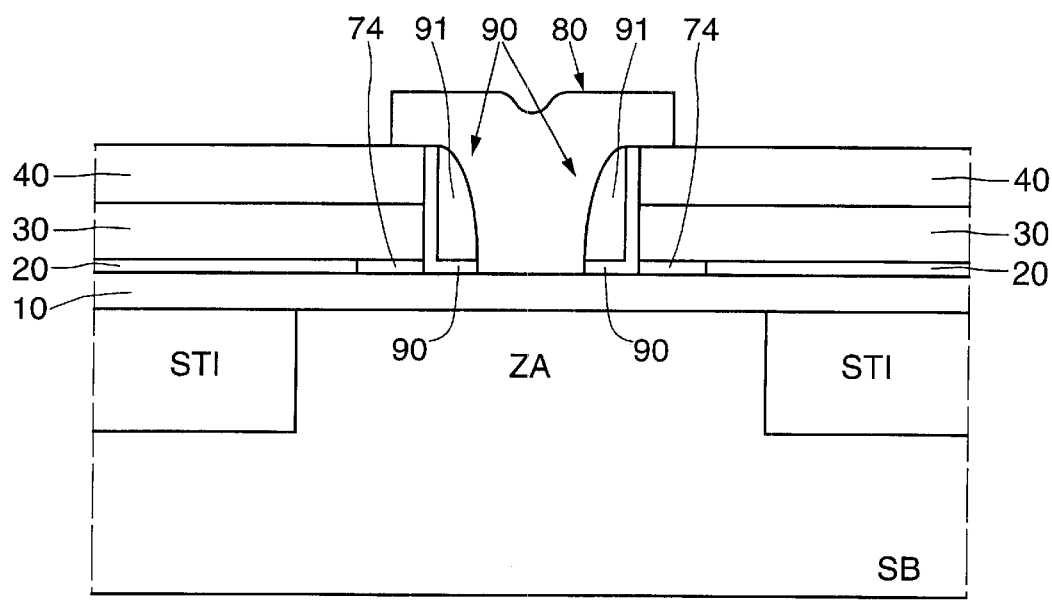

Next as illustrated in FIG. 5, the replacement material 70 undergoes selective isotropic etching, using any conventional oxidant chemistry, for example a solution of 40 ml 70% HNO$_3$+20 ml H$_2$O$_2$+5 ml 0.5% HF, or even isotropic plasma etching. Since the ratio of the length L of the portion 74 to the thickness of the layer of deposited material 70 has been correctly chosen, a large part at least of the portion 74 of the layer 70 remains after this isotropic etching.

The method of fabricating the transistor according to the invention is then completed by forming internal insulation regions or spacers 90 from two different insulating materials (dielectrics).

In this instance, a layer of silicon dioxide obtained from TEOS is deposited on the walls and in the bottom of the emitter window, then silicon nitride is deposited. The silicon nitride is then etched so as to form the spacer part 91. This etching is stopped on the lower layer of silicon oxide obtained from TEOS, which has the advantage of not damaging the underlying intrinsic base region. Conventional deoxidation of that portion of the layer of silicon oxide obtained from TEOS situated between the spacers 90 is then carried out, so as to obtain the spacer structure illustrated in this FIG. 5 and which comprises, under the silicon nitride part 91, a layer 90 of silicon oxide obtained from TEOS.

The emitter 80 is then deposited and rests, in its lower part, on the intrinsic base region and, in its upper part, partly on the insulating region 40.

The method of fabrication is then continued in a manner known to those of average skill in the art, in particular, by making contact terminals on the emitter, the extrinsic base and the collector.

In this FIG. 5, which illustrates one embodiment of a transistor according to the invention, it can be seen that the extrinsic base region 30 rests on the semiconducting heterojunction region 10 via a separating layer formed from the residual portion 20 of the stop layer (here made of silicon oxide obtained from TEOS) and from the portion 74 of the replacement material which forms part of the electrically conducting connection. This portion 74, situated just outside the emitter region, provides an electrical contact between the extrinsic base 30 and the intrinsic base situated in the heterojunction region 10.

Moreover, as well as the self-aligned nature of the structure obtained, the good conductivity of the connection part 74 contributes to minimizing the base resistance of the transistor.

In addition, in the method of fabrication according to the invention, the layer 70 is etched immediately after it is deposited and it remains only at the periphery of the emitter. In this case, the process according to the invention therefore does not envisage either heat treatment or a photolithographic step. Consequently, the drawbacks linked to possible p⁺-contamination of the epitaxially grown intrinsic base, or to steps of resin removal, are therefore non-existent.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method for fabricating a self-aligned double-polysilicon type bipolar transistor with a heterojunction base comprising the steps of:

forming a semiconductor substrate with an active region;

forming an isolating region that surrounds the active region of the semiconductor substrate; and forming a semiconducting heterojunction region on top of the active region and the isolating region by non-selective epitaxy;

forming a stack on top of the active region comprising the sub-steps of:

disposing an etch stop layer on top of the active region;

disposing a polysilicon layer having the same type of conductivity as the semiconducting heterojunction region, wherein the polysilicon layer is overdoped with respect to the semiconducting heterojunction region;

disposing at least one upper insulating layer;

defining an emitter window with an outer periphery above the active region by etching the stack so as to stop at the etch stop layer;

replacing the etch stop layer by an electrically conducting replacement material at the outer periphery of the emitter window; and forming an emitter region resting partially on the at least one upper insulating layer.

2. The method according to claim 1, wherein the step of forming a semiconducting heterojunction region includes forming a semiconducting heterojnction region comprising a layer made of a silicon-germanium alloy surmounted by a silicon layer.

3. The method according to claim 2, wherein the step of replacing the etch stop layer includes etching the replacement material so as to leave the replacement material only between the semiconducting heterojunction region and the polysilicon layer.

4. The method according to claim 2, wherein the step of disposing a stop layer includes disposing a stop layer formed from the same material as a material forming the at least one upper insulating layer of the stack.

5. A method for fabricating a self-aligned double-polysilicon type bipolar transistor with a heterojunction base comprising the steps of:

forming a semiconductor substrate with an active region;

forming an isolating region that surrounds the active region of the semiconductor substrate; and forming a semiconducting heterojunction region on top of the active region and the isolating region by non-selective epitaxy, wherein the heterojunction region comprises a layer made of a silicon-germanium alloy surmounted by a silicon layer and a layer made of a silicon-germanium alloy surmounted by a silicon layer;

forming a stack on top of the active region comprising the sub-steps of:

disposing an etch stop layer on top of the active region, wherein the stop layer includes disposing a stop layer formed from the same material as a material forming the at least one upper insulating layer of the stack; and disposing a protective layer on top of the at least one upper insulating layer and on top of the outer periphery of the emitter window, wherein the protective layer is made of a material which is different than a material forming the etch stop layer and wherein in the step of replacing the etch stop layer by an electrically conducting replacement material at the outer periphery of the emitter window includes replacing the the protective layer with the electrically conducting replacement material;

disposing a polysilicon layer having the same type of conductivity as the semiconducting heterojunction region, wherein the polysilicon layer is overdoped with respect to the semiconducting heterojunction region;

disposing at least one upper insulating layer;

defining an emitter window with an outer periphery above the active region by etching the stack so as to stop at the etch stop layer;

replacing the etch stop layer by an electrically conducting replacement material at the outer periphery of the emitter window; and forming an emitter region resting partially on the at least one upper insulating layer.

6. The method according to claim 5, wherein in the step of disposing an etch stop layer includes disposing an etch stop layer formed from silicon oxide.

7. The method accorind to claim 6, wherein in the step of disposing at least one upper insulating layer includes disposing at least one upper insulating layer formed from silicon oxide.

8. The method according to claim 5, wherein in the step of disposing a protective layer includes displosing a protective layer formed from silicon nitride.

9. A method for fabricating a self-aligned double-polysilicon type bipolar transistor with a heterojunction base comprising the steps of:

forming a semiconductor substrate with an active region;

forming an isolating region that surrounds the active region of the semiconductor substrate; and forming a semiconducting heterojunction region on top of the active region and the isolating region by non-selective epitaxy, wherein the heterojunction region;

forming a stack on top of the active region comprising the sub-steps of:

disposing an etch stop layer on top of the active region;

disposing a polysilicon layer having the same type of conductivity as the semiconducting heterojunction region, wherein the polysilicon layer is overdoped with respect to the semiconducting heterojunction region;

disposing at least one upper insulating layer;

defining an emitter window with an outer periphery above the active region by etching the stack so as to stop at the etch stop layer;

replacing the etch stop layer by an electrically conducting replacement material at the outer periphery of the emitter window and wherein the etch stop layer includes replacing the etch stop layer by isotropical etching so that the stop layer under the polysilicon layer is locally removed over a length (L) which is at least five times greater than a thickness of the replacement material; and forming an emitter region resting partially on the at least one upper insulating layer.

10. The method according to claim 5, wherein the step of replacing the etch stop layer includes replacing the etch stop layer by isotropical etching so that the stop layer under the polysilicon layer is locally removed over a length (L) which is at least five times greater than a thickness of the replacement material.

11. The method according to claim 1, wherein the step of replacing the etch stop layer included replacing the etch stop layer with a replacement material formed from a heavily doped silicon-germanium alloy.

12. The method according to claim 10, wherein the step of replacing the etch stop layer included replacing the etch stop layer with a replacement material formed from a heavily doped silicon-germanium alloy.

13. The method according to claim 1, wherein the step of forming the emitter region includes forming the emitter region with electrically insulation regions comprising two different insulation materials.

14. A method for fabricating a self-aligned double-polysilicon type bipolar transistor with a heterojunction base, the transistor comprising a semiconducting heterojunction region lying over an active region of a semiconductor substrate and over an isolating region delimiting the active region, and incorporating an intrinsic base region, wherein the semiconducting region forms an upper surface, the method comprising the steps of:

forming an emitter window with an outer periphery above the active region, by etching a stack formed from layers of:
  an etch stop layer on top of the active region;
  a polysilicon layer on top of the etch stop layer having the same type of conductivity as the semiconducting heterojunction region, wherein the polysilicon layer is overdoped with respect to the semiconducting heterojunction region; and
  an upper insulating layer on top of the polysilicon layer;
replacing the etch stop layer by an electrically conducting replacement material at the outer periphery of the emitter window; and forming an emitter region resting partially on the upper insulating layer.

15. The method according to claim 2, wherein the step of replacing the etch stop layer included replacing the etch stop layer with a replacement material formed from a heavily doped silicon-germanium alloy.

16. The method according to claim 4, wherein the step of replacing the etch stop layer included replacing the etch stop layer with a replacement material formed from a heavily doped silicon-germanium alloy.

17. The method according to claim 5, wherein the step of replacing the etch stop layer included replacing the etch stop layer with a replacement material formed from a heavily doped silicon-germanium alloy.

18. The method according to claim 7, wherein the step of replacing the etch stop layer included replacing the etch stop layer with a replacement material formed from a heavily doped silicon-germanium alloy.

19. The method according to claim 9, wherein the step of replacing the etch stop layer included replacing the etch stop layer with a replacement material formed from a heavily doped silicon-germanium alloy.

20. The method according to claim 2, wherein the step of forming the emitter region includes forming the emitter region with electrically insulation regions comprising two different insulation materials.

21. The method according to claim 4, wherein the step of forming the emitter region includes forming the emitter region with electrically insulation regions comprising two different insulation materials.

22. The method according to claim 5, wherein the step of forming the emitter region includes forming the emitter region with electrically insulation regions comprising two different insulation materials.

23. The method according to claim 10, wherein the step of forming the emitter region includes forming the emitter region with electrically insulation regions comprising two different insulation materials.

* * * * *